United States Patent [19]
Chung

[11] Patent Number: 5,733,691
[45] Date of Patent: Mar. 31, 1998

[54] ONE-STEP METHOD FOR ON-LINE LITHOGRAPHIC PATTERN INSPECTION

[75] Inventor: Wen-Jye Chung, Hsin-Chu, Taiwan

[73] Assignee: Taiwan Semiconductor Manufacturing Company, Ltd., Hsin-Chu, Taiwan

[21] Appl. No.: 782,711

[22] Filed: Jan. 13, 1997

[51] Int. Cl.⁶ .................................................. G03F 9/00
[52] U.S. Cl. .................................................. 430/5; 430/30
[58] Field of Search ............................... 430/5, 30, 311, 430/326, 394

[56] References Cited

U.S. PATENT DOCUMENTS

| | | |
|---|---|---|
| 4,788,117 | 11/1988 | Cuthbert et al. ............... 430/30 |
| 5,593,815 | 1/1997 | Ahn ..................................... 430/321 |

*Primary Examiner*—S. Rosasco
*Attorney, Agent, or Firm*—George O. Saile; Stephen B. Ackerman

[57] ABSTRACT

A mask is provided, for positive resists, that includes an opaque area and a partially transparent area, there being a straight line boundary between the two. The feature to be photocleaved is a clear area located midway between these areas so that it is bisected by the boundary. For negative resists, the mask includes a clear area and a partially transparent area, the feature to be photocleaved now being an opaque area. The photoresist (positive or negative) is first given a normal dose of actinic radiation, directed through the mask and is developed. After development has been performed, a photocleaved structure results.

14 Claims, 3 Drawing Sheets

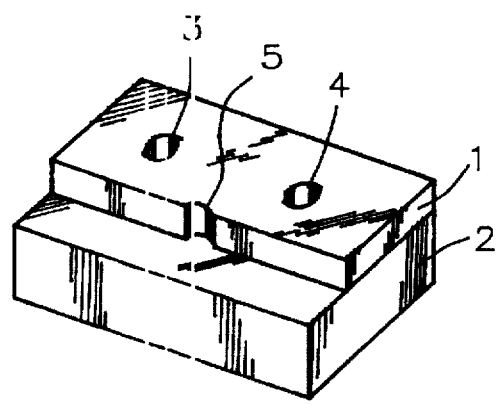
*FIG. 1 - Prior Art*
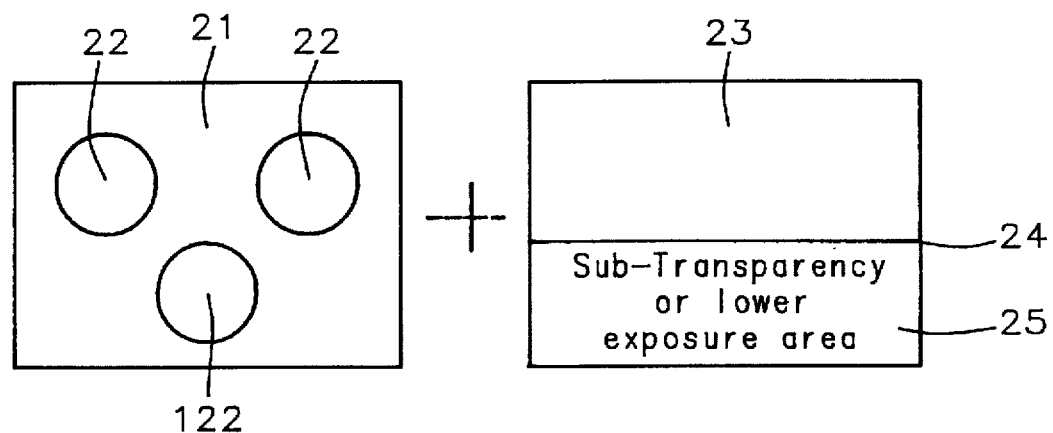
*FIG. 2a*
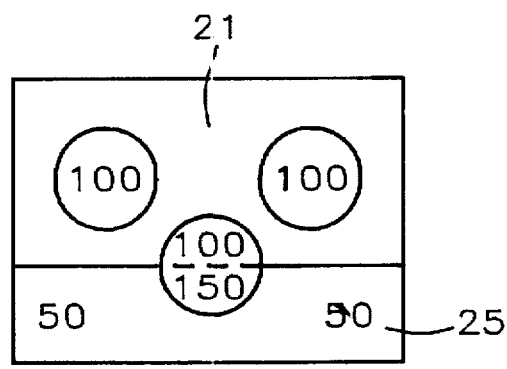
*FIG. 2b*

5,733,691

ONE-STEP METHOD FOR ON-LINE LITHOGRAPHIC PATTERN INSPECTION

BACKGROUND OF THE INVENTION (1) Field of the Invention

The invention relates to the general field of photo-lithography, more particularly to on-line inspection of photo-lithographic patterns in integrated circuits.

(2) Description of the Prior Art

Photolithography has been routinely used in the semiconductor industry for many years. As circuits grow ever more dense, finer and finer lines are used to form devices and interconnections. As the resolution limit of the actinic radiation that is used to expose the photoresist is approached, the probability that not all lines, holes, etc. will be perfectly formed increases. Thus, inspection of the developed photoresist, particularly the first time a given pattern and/or set of exposure conditions are used, plays an increasingly important role.

Inspection of the developed photoresist may be by optical means or higher resolution techniques, such as scanning electron microscopy, may be used. In general, simply viewing the photo resist image will not be sufficient. In features, such as lines or holes, defects in the resist image can only be seen by first cross-sectioning the feature.

A convenient method for cross-sectioning a photoresist feature, called photocleaving, has been described by Cuthbert et al. (U.S. Pat. No. 4,788,117 Nov. 1988). The method, which is limited to use with positive photoresists, involves a two step process. First, the photoresist is exposed to actinic radiation through a mask that includes the feature in question. A normal exposure is used—that is, the radiation dose is sufficient to make quite sure that exposed portions of the resist will be washed away during development.

A second mask, containing a clear area and an opaque area, separated by a straight line boundary, is then aligned so that this boundary bisects the feature and the resist is given a second exposure. Cuthbert et al. state that the second exposure should preferably be less than normal—barely sufficient to ensure the subsequent removal of exposed material.

Once the resist is developed, half the feature will have been removed and half will be intact, thereby providing a cross-sectioned feature. An example of a cross-section obtained by photocleaving is illustrated in FIG. 1. Exposed and developed layer of photoresist 1 is seen on top of substrate 2. Layer 1 includes three features, holes 3 and 4 which have their normal appearance and hole 5 which has been photocleaved. As explained by Cuthbert et al., when the wavelength of the actinic radiation is close to the dimensions of the feature to be cross-sectioned, a good cross-section will not be obtained by simply including a bisected feature in the original mask. Any sharp points in such a feature will be rounded because of the resolution limitation, whereas this does not occur if the photocleaving method just described is used.

Particularly when used in a production environment, the photocleaving method of Cuthbert et al. suffers from several limitations. In particular, two masks and two alignment steps are needed. In an earlier application, submitted by the same inventor (08/709,899 filed Sep. 9, 1996), and also limited to positive photoresists, a photocleaving method was described that requires only a single alignment step and, when used in a production environment, only a single exposure.

FIG. 2a shows the two masks described in the earlier application. The first mask consists of an opaque area 21 and transparent areas such as 22 and 122. This is exposed in the normal way so that, after development, areas 22 and 122 would be removed while 21 would remain. The second mask consists of an opaque area 23 and a semi-transparent or clear area 25 that requires lower exposure energy, the two areas being separated by straight line boundary 24. The second mask is aligned to the wafer that has been exposed through the first mask (but not developed) so that boundary 24 bisects feature 122 and a second exposure is given. FIG. 2b shows the exposure that each region receives. If a normal unattenuated exposure is arbitrarily given a value of 100 then the optimal energy to cleave the photoresist during development is 50.

The present invention teaches a method for achieving photocleaving of quality comparable to that achieved by the method of Cuthbert et al. but requires only a single mask with no alignment step and can be used with both positive and negative photoresists.

SUMMARY OF THE INVENTION

It has been an object of the present invention to provide a one-step method for the on-line inspection of photoresist patterns of the type used in the manufacture of semiconductor circuits.

An additional object of the present invention is that it result in the effective photocleaving of specific mask features.

Another object of the present invention is that said method be applicable to both positive and negative photoresists.

Yet another object of the invention is to describe the form of the masks to be used in said method A further object of the present invention is that no alignment step be added to the process currently in use.

A still further object of the present invention is that said inspection method should not require any significant modification of, or add additional cost to, the methods currently in use.

These objects have been achieved by providing, for positive resists, a mask that includes an opaque area and a partially transparent area, there being a straight line boundary between the two. The feature to be photocleaved is a clear area located midway between these areas so that it is bisected by said boundary. For negative resists, the mask includes a clear area and a partially transparent area, the feature to be photocleaved now being an opaque area. To use the method, the photoresist (positive or negative) is given a normal dose of actinic radiation, directed through the mask, and is developed.

BRIEF DESCRIPTION OF THE DRAWINGS

FIG. 1 Shows the appearance of a single feature (a hole) that has been photocleaved.

FIG. 2a shows the masks that were used together to achieve photocleaving by a method used by us prior to the present invention.

FIG. 2b shows the relative radiation doses received in different areas when the method associated with the masks of FIG. 2a was used.

DESCRIPTION OF THE PREFERRED EMBODIMENTS

Figure 3A:
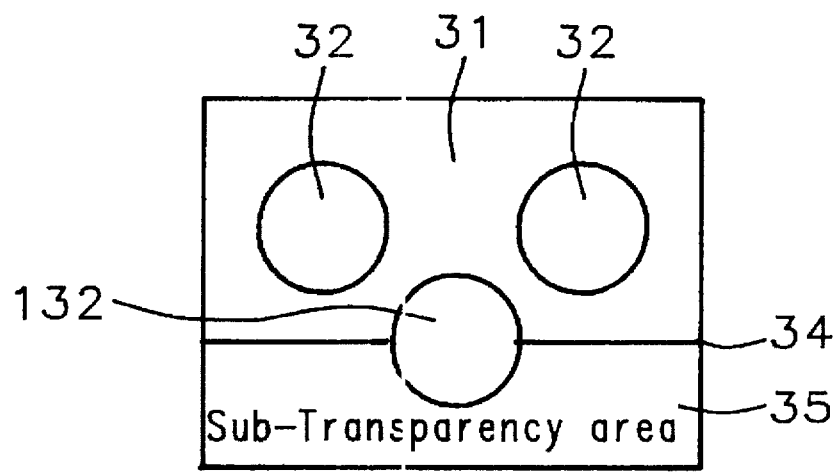
FIG. 3a shows the single mask that is used to achieve photocleaving of a positive photoresist according to the teachings of the present invention.

As a first step in explaining the method of the present invention we will describe our photocleaving structure. FIG. 3a illustrates the single mask that will be used for photocleaving a positive photoresist. Area 31 is opaque while areas 32 and 132 are clear. Area 35 is a partially transparent area that transmits a percentage of any actinic radiation directed through it, typically between about 5 and 80%, the exact amount being determined by experiment on a case by case basis. Boundary 34 between areas 31 and 35 is a straight line and clear area 132 (which is to be photocleaved) is located partly in the opaque area and partly in the partially transparent area such that it is bisected by boundary 34.

Figure 3B:
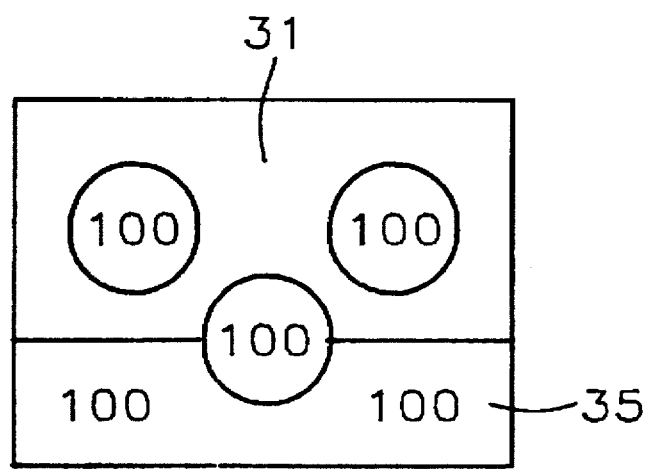
FIG. 3b shows the relative radiation doses received in different areas when the method associated with the mask of FIG. 3a was used.

The structure shown in FIG. 3a is used for photocleaving as follows: First a substrate is coated with a layer of a positive photoresist. The photoresist is then given a normal dose of actinic radiation, directed through the mask of FIG. 3a and the photoresist is developed in the usual way. 'Normal dose' refers to the exposure energy used in the standard production environment when printing a circuit pattern. The transparency of area 35 in FIG. 3a is chosen so that during a normal exposure the photoresist in area 35 in FIG. 3b receives the minimum amount of radiation needed to cause it to be removed in the development process.

Figure 4A:
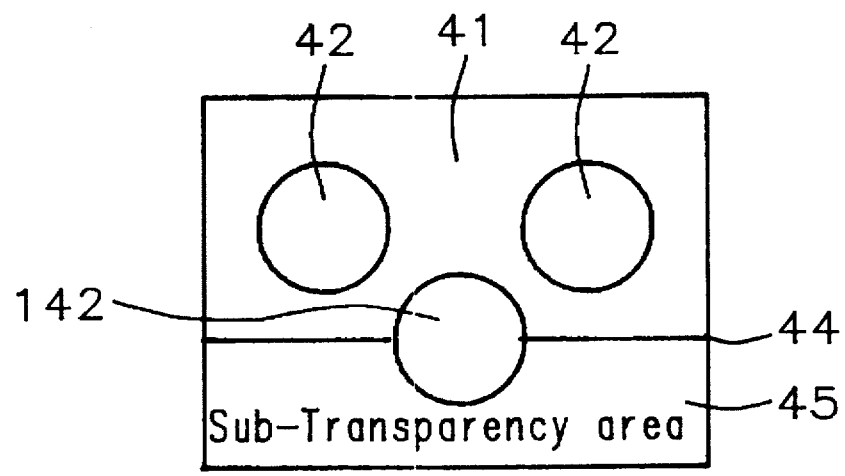
FIG. 4a shows the single mask that is used to achieve photocleaving of a negative photoresist according to the teachings of the present invention.
Figure 4B:
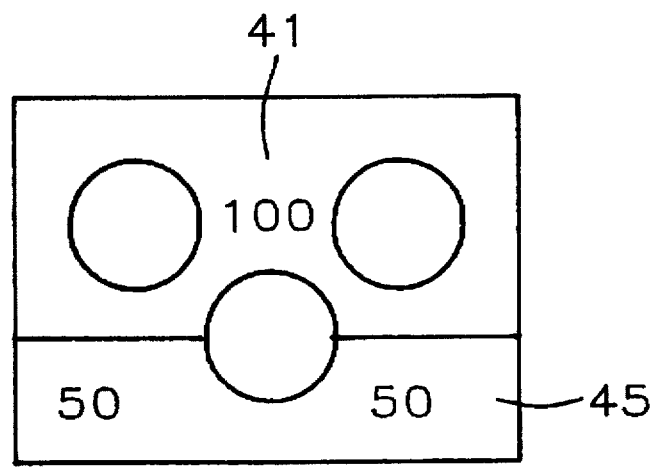
FIG. 4b shows the relative radiation doses received in different areas when the method associated with the mask of FIG. 4a was used.

FIG. 4a illustrates the single mask that is used for photo-cleaving a negative photoresist. Area 41 is clear while areas 42 and 142 are opaque. Area 45 is a partially transparent area that transmits a percentage of any actinic radiation directed through it, typically between about 5 and 80%, the exact amount being determined by experiment on a case by case basis. Boundary 44 between areas 41 and 45 is a straight line and opaque area 142 (which is to be photocleaved) is located partly in the clear area and partly in the partially transparent area such that it is bisected by boundary 44.

The structure shown in FIG. 4a is used for photocleaving as follows: First a substrate is coated with a layer of a negative photoresist. The photoresist is then given a normal dose of actinic radiation, directed through the mask of FIG. 4a, 'normal dose' being as defined above. The transparency of area 45 in FIG. 4a is chosen so that during a normal exposure the photoresist in area 35 in FIG. 3b receives the maximum amount of radiation that it can absorb and still be removed in the development process.

Once photocleaving has been achieved, for either the positive or the negative resist, all that remains is to inspect the photocleaved structure. This may be accomplished either through optical microscopy or, more effectively, by means of scanning electron microscopy.

To conclude the description of these two embodiments of our invention it is worthwhile to indicate how the partially transmitting areas that are key to the invention may be formed. In principle, the attenuating area could be formed from a semi-transparent metal layer. Such layers are commonly used in optical beam splitters. In practice, however, the masks used for photolithography in integrated circuits are made from relatively thick layers of chromium or similar metal. To make part of such a mask semi-transparent would be time consuming and expensive. Accordingly, we have used a subresolution pattern to achieve the same result.

A sub-resolution pattern consists of a set of fully opaque and fully transparent areas of a size and separation that is below the resolution limit of the radiation that is to pass through it. Thus, a certain fraction of the incident radiation passes through the transparent areas and the rest is blocked. Since the wavelength of the radiation (which varies from case to case but generally is less than about 4,500 Angstroms) is too long to resolve the different areas, all that emerges is an attenuated beam.

While the invention has been particularly shown and described with reference to the preferred embodiments thereof, it will be understood by those skilled in the art that various changes in form and details may be made without departing from the spirit and scope of the invention.

What is claimed is:

1. A one step photocleaving structure, located within a mask that is used with a positive photoresist, comprising:

an opaque area;

a partially transparent area that transmits a percentage of actinic radiation directed through it, there being a straight line boundary between the opaque and partially transparent areas; and a clear area located partly in the opaque area and partly in the partially transparent area such that it is bisected by said boundary.

2. The structure of claim 1 wherein the percentage of actinic radiation transmitted by the partially transparent area is between about 5 and 80%.

3. The structure of claim 1 wherein the partially transparent area further comprises fully opaque and fully transparent areas of a size and separation that are below the resolution limit of said actinic radiation.

4. The structure of claim 1 wherein the partially transparent area further comprises a uniform layer of semi-transparent material.

5. A one step photocleaving structure, located within a mask that is used with negative photoresist, comprising:

a clear area;

a partially transparent area that transmits a percentage of actinic radiation directed through it, there being a straight line boundary between the clear and partially transparent areas; and an opaque area located partly in the clear area and partly in the partially transparent area such that it is bisected by said boundary.

6. The structure of claim 5 wherein the percentage of actinic radiation transmitted by the partially transparent area is between about 5 and 80%.

7. The structure of claim 5 wherein the partially transparent area further comprises fully opaque and fully transparent areas of a size and separation that is below the resolution limit of said actinic radiation.

8. The structure of claim 5 wherein the partially transparent area further comprises a uniform layer of semi-transparent material.

9. A method for the on-line inspection of a photolithographic pattern, comprising the sequential steps of:

(a) coating a substrate with a layer of a positive photoresist;

(b) providing a mask that includes a one step photocleaving structure;

(c) exposing the photoresist to a normal dose of actinic radiation, directed through the mask;

(d) developing the photoresist; and (e) inspecting the photocleaved structure.

10. The method of claim 9 wherein said one step photocleaving structure includes a partially transparent area.

11. The method of claim 9 wherein the wavelength of the actinic radiation is less than about 4,500 Angstroms.

12. A method for the on-line inspection of a photolithographic pattern comprising:

(a) coating a substrate with a layer of a negative photoresist;

(b) providing a mask that includes a one step photocleaving structure;

(c) exposing the photoresist to a normal dose of actinic radiation, directed through the mask;

(d) developing the photoresist; and (e) inspecting the photocleaved structure.

13. The method of claim 12 wherein said one step photocleaving structure includes a partially transparent area.

14. The method of claim 12 wherein the wavelength of the actinic radiation is less than about 4,500 Angstroms.

* * * * *